(12) United States Patent
Zheng

(10) Patent No.: US 12,073,765 B2
(45) Date of Patent: Aug. 27, 2024

(54) SHIFT REGISTER UNIT, DRIVING CIRCUIT, DISPLAY DEVICE AND DRIVING METHOD

(71) Applicant: BOE TECHNOLOGY GROUP CO., LTD., Beijing (CN)

(72) Inventor: Can Zheng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/336,565

(22) Filed: Jun. 16, 2023

(65) Prior Publication Data

US 2023/0326389 A1  Oct. 12, 2023

Related U.S. Application Data

(63) Continuation of application No. 18/092,974, filed on Jan. 4, 2023, now Pat. No. 11,854,460, which is a continuation of application No. 17/696,251, filed on Mar. 16, 2022, now Pat. No. 11,574,581, which is a continuation of application No. 16/642,140, filed as application No. PCT/CN2019/079171 on Mar. 22, 2019, now Pat. No. 11,308,854.

(51) Int. Cl.
*G09G 3/20* (2006.01)

(52) U.S. Cl.
CPC ...... *G09G 3/2092* (2013.01); *G09G 2310/0286* (2013.01)

(58) Field of Classification Search
CPC .... G11C 19/28; G11C 19/184; G09G 3/3266; G09G 3/20; G09G 3/3674; G09G 3/2092; G09G 2310/0286; G09G 2310/08; G09G 2310/061

See application file for complete search history.

(56) References Cited

U.S. PATENT DOCUMENTS 9,548,026 B2   1/2017 Jang
10,276,254 B2  4/2019 Xiang et al.
(Continued)

FOREIGN PATENT DOCUMENTS

CN   103662633 A   3/2014
CN   104318909 A   1/2015
(Continued)

OTHER PUBLICATIONS

International Search Report of PCT/CN2019/079171 in Chinese, mailed Dec. 30, 2019 with English Translation.
(Continued)

*Primary Examiner* — Christopher E Leiby
(74) *Attorney, Agent, or Firm* — Collard & Roe, P.C.

(57) ABSTRACT

A shift register unit, a driving circuit, a display device, and a driving method are disclosed. The shift register unit includes a first input circuit, a second input circuit, an output circuit, a first control circuit, and a second control circuit, wherein the first input circuit is electrically connected to a first node; the second input circuit is electrically connected to the first node and a second node; the first control circuit is electrically connected to the second node and a third node; the output circuit is electrically connected to the third node, a second voltage signal line and an output terminal; and the second control circuit is electrically connected to the first node, the third node and a first voltage signal line.

19 Claims, 7 Drawing Sheets

(56) References Cited

U.S. PATENT DOCUMENTS

| | | |
|---|---|---|
| 10,360,830 B2 | 7/2019 | Yang et al. |
| 10,482,812 B1 | 11/2019 | Zhai |
| 10,706,767 B2 | 7/2020 | Fan et al. |
| 10,714,053 B2 | 7/2020 | Zhu et al. |
| 2005/0017934 A1 | 1/2005 | Chung et al. |
| 2010/0177087 A1 | 7/2010 | Han |
| 2014/0055444 A1* | 2/2014 | Jang .................. G09G 3/3266 345/213 |
| 2016/0180800 A1 | 6/2016 | Zheng |
| 2016/0329015 A1 | 11/2016 | Ji et al. |
| 2016/0351156 A1 | 12/2016 | Wu et al. |
| 2017/0004775 A1 | 1/2017 | Chen et al. |
| 2017/0200418 A1 | 7/2017 | Zhang et al. |
| 2017/0345366 A1 | 11/2017 | Jang |
| 2018/0218695 A1 | 8/2018 | Li |
| 2018/0322820 A1 | 11/2018 | Yang et al. |
| 2019/0066604 A1 | 2/2019 | Kong et al. |
| 2020/0184873 A1 | 6/2020 | Zheng |

FOREIGN PATENT DOCUMENTS

| | | |
|---|---|---|
| CN | 105321490 A | 2/2016 |
| CN | 105845183 A | 8/2016 |
| CN | 106128347 A | 11/2016 |
| CN | 106328054 A | 1/2017 |
| CN | 106486065 A | 3/2017 |
| CN | 107358914 A | 11/2017 |
| CN | 107424649 A | 12/2017 |
| CN | 107863057 A | 3/2018 |
| CN | 108538336 A | 9/2018 |
| CN | 108735151 A | 11/2018 |
| CN | 108777129 A | 11/2018 |
| CN | 109389927 A | 2/2019 |
| CN | 109427285 A | 3/2019 |
| JP | 2005031630 A | 2/2005 |
| JP | 2014041337 A | 3/2014 |
| JP | 2019504335 A | 2/2019 |
| WO | 2017/107746 A1 | 6/2017 |
| WO | 2018/119963 A1 | 7/2018 |

OTHER PUBLICATIONS

Notice of Transmittal of the International Search Report of PCT/CN2019/079171 in Chinese, mailed Dec. 30, 2019.

Written Opinion of the International Searching Authority of PCT/CN2019/079171 in Chinese, mailed Dec. 30, 2019.

Indian Office Action in Indian Application No. 202047047188 dated Dec. 7, 2021 with English translation.

U.S. Non-Final Office Action in U.S. Appl. No. 16/642,140 dated Mar. 26, 2021.

U.S. Final Office Action in U.S. Appl. No. 16/642,140 dated Jul. 19, 2021.

U.S. Non-Final Office Action in U.S. Appl. No. 16/642,140 dated Oct. 28, 2021.

U.S. Notice of Allowance in U.S. Appl. No. 16/642,140 mailed on Jan. 7, 2022.

U.S. Corrected Notice of Allowability in U.S. Appl. No. 16/642,140 mailed on Jan. 21, 2022.

U.S. Corrected Notice of Allowability in U.S. Appl. No. 16/642,140 mailed on Mar. 11, 2022.

Extended European Search Report in European Application No. 19853279.8 dated Aug. 29, 2022.

U.S. Notice of Allowance in U.S. Appl. No. 17/696,251 mailed on Oct. 5, 2022.

U.S. Corrected Notice of Allowability in U.S. Appl. No. 17/696,251 mailed on Oct. 18, 2022.

U.S. Corrected Notice of Allowability in U.S. Appl. No. 17/696,251 mailed on Nov. 23, 2022.

Japanese Office Action in Japanese Application No. 2020-563443 dated Mar. 7, 2023 with English translation.

U.S. Notice of Allowance in U.S. Appl. No. 18/092,974 mailed on Apr. 13, 2023.

* cited by examiner

SHIFT REGISTER UNIT, DRIVING CIRCUIT, DISPLAY DEVICE AND DRIVING METHOD

CROSS REFERENCE TO RELATED APPLICATIONS

This application is a continuation of U.S. patent application Ser. No. 18/092,974 filed Jan. 4, 2023 which is a continuation of U.S. patent application Ser. No. 17/696,251 filed on Mar. 16, 2022 (now U.S. Pat. No. 11,574,581 issued Feb. 7, 2023) which is a continuation of U.S. patent application Ser. No. 16/642,140 filed Feb. 26, 2020 (now U.S. Pat. No. 11,308,854 issued Apr. 19, 2022), which is a National Stage of PCT/CN2019/079171 filed on Mar. 22, 2019, each of which is incorporated by reference herein in its entirety.

TECHNICAL FIELD

Embodiments of the present disclosure relate to a shift register unit, a driving circuit, a display device, and a driving method.

BACKGROUND

In the field of display technology, in order to improve the quality of the display image and the user experience, the realization of high PPI (Pixels Per Inch) and narrow bezel has gradually become a research direction. In recent years, with the continuous improvement of the manufacturing process of amorphous silicon thin film transistors or oxide thin film transistors, a driving circuit can be directly integrated on an array substrate of the thin film transistor to form a GOA (Gate driver On Array) to drive the display panel. The GOA technology helps to realize the narrow bezel design of the display panel and can reduce the production cost of the display panel.

SUMMARY

At least an embodiment of the present disclosure provides a shift register unit, comprising a first input circuit, a second input circuit, an output circuit, a first control circuit, and a second control circuit. The first input circuit is electrically connected to a first node, and is configured to transmit an input signal to the first node under control of a first clock signal; the second input circuit is electrically connected to the first node and a second node, and is configured to control a level of the second node under control of a level of the first node or the first clock signal; the first control circuit is electrically connected to the second node and a third node, and is configured to control a level of the third node under control of the level of the second node and a second clock signal; the output circuit is electrically connected to the third node and an output terminal, and is configured to output an output signal to the output terminal under control of the level of the third node; and the second control circuit is electrically connected to the first node and the third node, and is configured to control the level of the third node under control of the level of the first node.

For example, the shift register unit provided by an embodiment of the present disclosure further comprises an output reset circuit, the output reset circuit is electrically connected to the first node and the output terminal, and is configured to reset the output terminal under control of the level of the first node.

For example, the shift register unit provided by an embodiment of the present disclosure further comprises a third control circuit, the third control circuit is electrically connected to the first node, and is configured to adjust, by coupling, the level of the first node under control of the level of the first node.

For example, in the shift register unit provided by an embodiment of the present disclosure, the first input circuit comprises a first transistor, a gate electrode of the first transistor is configured to receive the first clock signal, a first electrode of the first transistor is configured to receive the input signal, and a second electrode of the first transistor is electrically connected to the first node.

For example, in the shift register unit provided by an embodiment of the present disclosure, the second input circuit comprises a second transistor and a third transistor, a gate electrode of the second transistor is electrically connected to the first node, a first electrode of the second transistor is configured to receive the first clock signal, and a second electrode of the second transistor is electrically connected to the second node; and a gate electrode of the third transistor is configured to receive the first clock signal, a first electrode of the third transistor is configured to receive a first low voltage, and a second electrode of the third transistor is electrically connected to the second node.

For example, in the shift register unit provided by an embodiment of the present disclosure, the first control circuit comprises a fourth transistor, a fifth transistor, and a first capacitor; a gate electrode of the fourth transistor is electrically connected to the second node, a first electrode of the fourth transistor is configured to receive the second clock signal, and a second electrode of the fourth transistor is electrically connected to a fourth node; a gate electrode of the fifth transistor is configured to receive the second clock signal, a first electrode of the fifth transistor is electrically connected to the fourth node, a second electrode of the fifth transistor is electrically connected to the third node; and a first electrode of the first capacitor is electrically connected to the second node, and a second electrode of the first capacitor is electrically connected to the fourth node.

For example, in the shift register unit provided by an embodiment of the present disclosure, the second control circuit comprises a sixth transistor, a gate electrode of the sixth transistor is electrically connected to the first node, a first electrode of the sixth transistor is configured to receive a first high voltage, and a second electrode of the sixth transistor is electrically connected to the third node.

For example, in the shift register unit provided by an embodiment of the present disclosure, the output circuit comprises a seventh transistor and a second capacitor, a gate electrode of the seventh transistor is electrically connected to the third node, a first electrode of the seventh transistor is configured to receive a second high voltage, and a second electrode of the seventh transistor is electrically connected to the output terminal; and a first electrode of the second capacitor is electrically connected to the third node, and a second electrode of the second capacitor is electrically connected to the first electrode of the seventh transistor.

For example, in the shift register unit provided by an embodiment of the present disclosure, the output reset circuit comprises an eighth transistor, a gate electrode of the eighth transistor is electrically connected to the first node, a first electrode of the eighth transistor is configured to receive a second low voltage, and a second electrode of the eighth transistor is electrically connected to the output terminal.

For example, in the shift register unit provided by an embodiment of the present disclosure, the third control circuit comprises a ninth transistor and a third capacitor, a gate electrode of the ninth transistor is electrically connected to the first node, a first electrode of the ninth transistor is configured to receive the second clock signal, a second electrode of the ninth transistor is electrically connected to a first electrode of the third capacitor, and a second electrode of the third capacitor is electrically connected to the first node.

At least an embodiment of the present disclosure further provides a driving circuit, comprising a plurality of cascaded shift register units each of which is provided by any one of the embodiments of the present disclosure, except a first-stage of the shift register units, any one of the shift register units of other stages is connected with the output terminal of a shift register unit of a preceding stage before the any one of the shift register units of other stages.

For example, the driving circuit provided by an embodiment of the present disclosure further comprises a first clock signal line and a second clock signal line, a (2n−1)th-stage of the shift register units is electrically connected to the first clock signal line to receive the first clock signal, and the (2n−1)th-stage of the shift register units is electrically connected to the second clock signal line to receive the second clock signal; a (2n)th-stage of the shift register units is electrically connected to the second clock signal line to receive the first clock signal, and the (2n)th-stage of the shift register units is electrically connected to the first clock signal line to receive the second clock signal; and n is an integer greater than zero.

At least an embodiment of the present disclosure further provides a display device, comprising the driving circuit provided by any one of the embodiments of the present disclosure.

For example, the display device provided by an embodiment of the present disclosure further comprises a plurality of pixel units arranged in an array, each of the plurality of pixel units comprises a pixel circuit, the pixel circuit comprises a data writing sub-circuit, a driving sub-circuit, and a light-emitting control sub-circuit; an output terminal of an (n)th-stage of the shift register units in the driving circuit is electrically connected to a control terminal of the light-emitting control sub-circuit of the pixel circuit in an (n)th row of the pixel units; and n is an integer greater than zero.

At least an embodiment of the present disclosure further provides a driving method of the shift register unit, comprising a preliminary stage, a pull-up stage, a high-potential maintenance stage, a pull-down stage, and a low-potential maintenance stage, in the preliminary stage, causing the second clock signal to be changed from a low level to a high level, causing the input signal to be changed from a low level to a high level, and causing the level of the first node to be pulled up; in the pull-up stage, causing the second clock signal to be changed from a high level to a low level, causing the level of the third node to be pulled down, and causing a level of the output signal to be pulled up; in the high-potential maintenance stage, causing the second clock signal to be changed from a low level to a high level, causing the level of the first node to be maintained at a high level, causing the level of the output signal to be maintained at a high level, and adjusting a pulse width of the output signal by adjusting a pulse width of the input signal; in the pull-down stage, causing the first clock signal to be changed from a high level to a low level, causing the level of the first node to be pulled down, causing the level of the third node to be pulled up, and causing the level of the output signal to be pulled down; and in the low-potential maintenance stage, causing the level of the first node to be maintained at a low level, causing the level of the third node to be maintained at a high level, and causing the level of the output signal to be maintained at a low level.

For example, in the driving method provided by an embodiment of the present disclosure, adjusting the pulse width of the output signal by adjusting the pulse width of the input signal comprises: in a case where the pulse width of the output signal needs to be increased, causing the high level of the input signal to be maintained to a time point, in a next period of the first clock signal, when the first clock signal is at a high level, thereby causing the pulse width of the output signal to be delayed by one period of the first clock signal.

For example, in the driving method provided by an embodiment of the present disclosure, a duty cycle of the first clock signal and a duty cycle of the second clock signal are both greater than 50%.

BRIEF DESCRIPTION OF THE DRAWINGS

In order to clearly illustrate the technical solution of the embodiments of the present disclosure, the drawings of the embodiments will be briefly described in the following. It is obvious that the described drawings in the following are only related to some embodiments of the present disclosure and thus are not limitative of the present disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", "coupled", etc., are not intended to define a physical connection or mechanical connection, but may include an electrical connection, directly or indirectly.

In the display panel technology, in order to achieve low cost and narrow bezel, a GOA (Gate driver On Array) technology can be adopted, that is, a driving circuit is integrated on a display panel through a thin film transistor manufacturing process, thereby realizing the advantages of narrow bezel and cost reduction.

Figure 1:
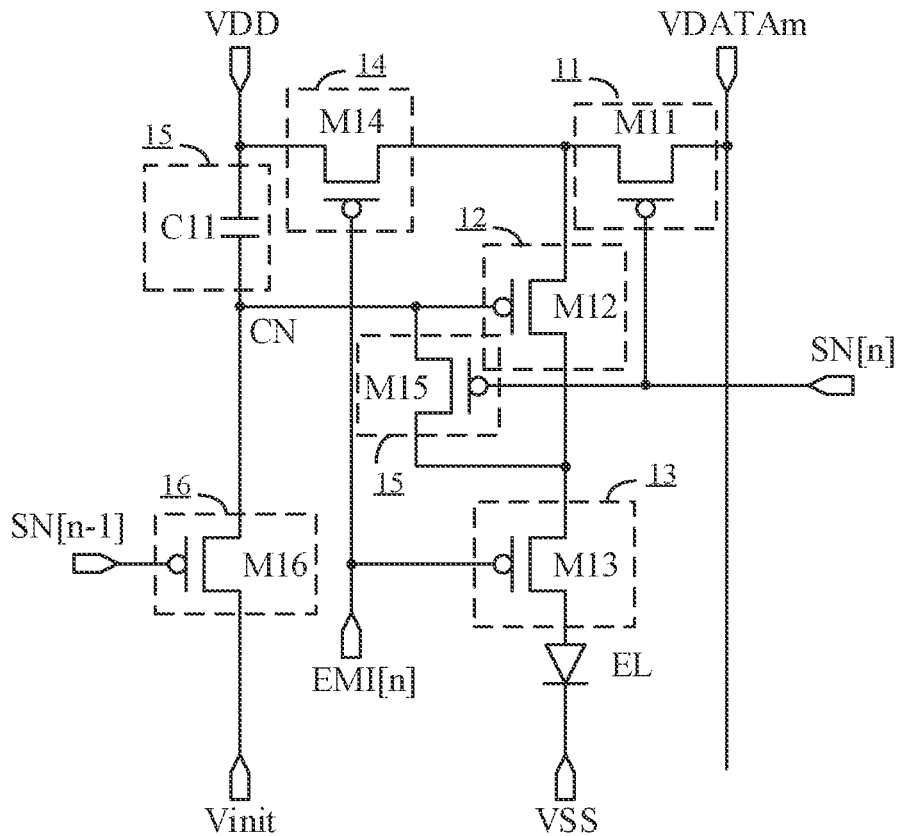
FIG. 1 is a schematic circuit diagram of a pixel circuit.

FIG. 1 is a schematic circuit diagram of a pixel circuit for a display device, the display device includes a plurality of pixel units arranged in an array, and each of the plurality of pixel units includes a pixel circuit as shown in FIG. 1. As shown in FIG. 1, the pixel circuit includes a data writing sub-circuit 11, a driving sub-circuit 12, a light-emitting control sub-circuit 13, a switching sub-circuit 14, an initialization sub-circuit 16, a light-emitting element EL, and a compensation sub-circuit 15.

For example, the data writing sub-circuit 11 is configured to write a data signal VDATAm to the driving sub-circuit 12 in response to a first scanning signal SN[n]. The driving sub-circuit 12 is configured to control a driving current that drives the light-emitting element EL to emit light. The light-emitting control sub-circuit 13 is configured to transmit the driving current provided by the driving sub-circuit 12 to the light-emitting element EL in response to a light-emitting control signal EMI[n]. The light-emitting element EL is configured to emit the light of a corresponding intensity in response to the driving current. The compensation sub-circuit 15 is configured to store the data signal written by the data writing sub-circuit 11 and compensate the driving sub-circuit 12 in response to the first scanning signal SN[n]. The switching sub-circuit 14 is configured to provide a first power supply voltage VDD to the driving sub-circuit 12 in response to the light-emitting control signal EMI[n]. The initialization sub-circuit 16 is configured to initialize the driving sub-circuit 12 and the compensation sub-circuit 15 in response to a second scanning signal SN[n-1].

For example, a gate line that provides the first scanning signal SN[n] may be electrically connected to the data writing sub-circuit 11 and the compensation sub-circuit 15 of the pixel circuit of an (n)th row of pixel units. A gate line that provides the second scanning signal SN[n-1] may be electrically connected to the data writing sub-circuit 11 and the compensation sub-circuit 15 of the pixel circuit of an (n-1)th row of pixel units, and may further be electrically connected to the initialization sub-circuit 16 of the pixel circuit of the (n)th row of pixel units.

As shown in FIG. 1, the data writing sub-circuit 11 may be implemented as a data writing transistor M11; the driving sub-circuit 12 may be implemented as a driving transistor M12; the light-emitting control sub-circuit 13 may be implemented as a light-emitting control transistor M13; the compensation sub-circuit 15 may be implemented as a compensation transistor M15 and a storage capacitor C11; the switching sub-circuit 14 may be implemented as a switching transistor M14; and the initialization sub-circuit 16 may be implemented as an initialization transistor M16. It should be noted that all transistors as shown in FIG. 1 are P-type transistors.

Figure 2:
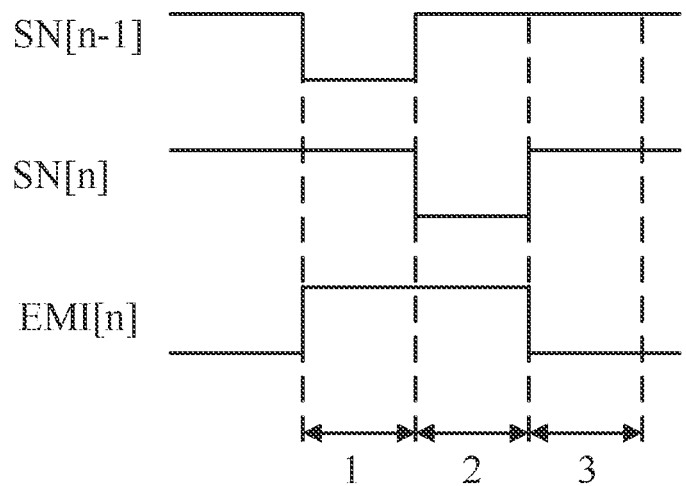
FIG. 2 is a signal timing diagram corresponding to the operation of the pixel circuit as shown in FIG. 1.

The working principle of the pixel circuit 10 as shown in FIG. 1 will be described below with reference to a timing diagram of control signals as shown in FIG. 2. For example, the working principle of the pixel circuit 10 includes the following stages.

In an initialization stage 1, the second scanning signal SN[n-1] is at a low level, and the first scanning signal SN[n] and the light-emitting control signal EMI[n] are at high levels. For example, the data writing transistor M11 and the compensation transistor M15 are turned off by the high level of the first scanning signal SN[n], the light-emitting control transistor M13 and the switching transistor M14 are turned off by the high level of the light-emitting control signal EMI[n], and the initialization transistor M16 is turned on by the low level of the second scanning signal SN[n-1], so a control node CN is electrically connected to an initial voltage terminal Vinit to receive an initial voltage. Therefore, during the initialization stage, the data signal stored in the storage capacitor C11 and a voltage of a gate electrode of the driving transistor M12 can be initialized.

In a programming stage 2, the second scanning signal SN[n-1] is at a high level, the first scanning signal SN[n] is at a low level, and the light-emitting control signal EMI[n] is at a high level. For example, the initialization transistor M16 is turned off by the high level of the second scanning signal SN[n-1], the light-emitting control transistor M13 and the switching transistor M14 are turned off by the high level of the light-emitting control signal EMI[n], and the data writing transistors M11 and the compensation transistor M15 are turned on by the low level of the first scanning signal SN[n], so the data signal VDATAm charges the gate electrode of the driving transistor M12 through the data writing transistor M11, the driving transistor M12, and the compensation transistor M15. According to the characteristics of the driving transistor M12, when the voltage of the gate electrode of the driving transistor M12 is charged to VDATAm-Vth (Vth is the threshold voltage of the driving transistor M12), the driving transistor M12 is turned off and the charging process ends.

In a light-emitting stage 3, the second scanning signal SN[n-1] and the first scanning signal SN[n] are at high levels, and the light-emitting control signal EMI[n] is at a low level. The initialization transistor M16 is turned off by the high level of the first scanning signal SN[n-1], the data writing transistor M11 and the compensation transistor M15 are turned off by the high level of the first scanning signal SN[n], and the light-emitting control transistor M13 and the switching transistor M14 are turned on by the low level of the light-emitting control signal EMI[n]. At this time, the driving current that generated in response to the voltage signal VDATAm-Vth applied to the gate electrode of the driving transistor M12 is supplied to the light-emitting element EL through the driving transistor M12, thereby causing the light-emitting element EL to emit light.

For example, an OLED display panel is provided with a plurality of pixel units arranged in an array, and each of the plurality of pixel units is provided with a pixel circuit, for example, the pixel circuit may adopt the pixel circuit as shown in FIG. 1. In order to drive the OLED display panel to perform a display operation, not only a gate driving circuit for providing the scanning signal (for example, the first scanning signal or the second scanning signal), but also a light-emitting control circuit for providing the light-emitting control signal EMI[n] is required. For example, similar to the gate driving circuit, the light-emitting control circuit can also be integrated on the display panel using the GOA technology. For example, the light-emitting control circuit may include a plurality of cascaded shift register units, and the plurality of shift register units are in one-to-one electrical connection with rows of pixel units in the display panel. For example, an output signal of an (n)th stage of the shift register units may be provided as a light-emitting control signal to the (n)th row of pixel units for controlling pixel circuits in the (n)th row of pixel units to emit light. For example, the light-emitting brightness of the pixel unit can be controlled by controlling the time during which the light-emitting control signal is at an active level.

In order to achieve a high PPI and a narrow bezel, it is necessary to reduce the area occupied by the light-emitting control circuit on the display panel, so it is necessary to simplify the circuit structure of the light-emitting control circuit (that is, the shift register unit).

At least one embodiment of the present disclosure provides a shift register unit including a first input circuit, a second input circuit, an output circuit, a first control circuit, and a second control circuit. The first input circuit is electrically connected to a first node, and is configured to transmit an input signal to the first node under the control of a first clock signal. The second input circuit is electrically connected to the first node and a second node, and is configured to control a level of the second node under the control of a level of the first node or the first clock signal. The first control circuit is electrically connected to the second node and a third node, and is configured to control a level of the third node under the control of the level of the second node and a second clock signal. The output circuit is electrically connected to the third node and an output terminal, and is configured to output an output signal to the output terminal under the control of the level of the third node. The second control circuit is electrically connected to the first node and the third node, and is configured to control the level of the third node under the control of the level of the first node.

At least some embodiments of the present disclosure further provide a driving circuit, a display device, and a driving method corresponding to the above-mentioned shift register unit.

The shift register unit, the driving circuit, the display device, and the driving method provided by some embodiments of the present disclosure can simplify the circuit structure, thereby achieving a narrow bezel and reducing costs. In addition, a pulse width of an output signal of the shift register unit provided by some embodiments can be adjusted.

The embodiments of the present disclosure and examples thereof will be described in detail below with reference to the drawings.

Figure 3:
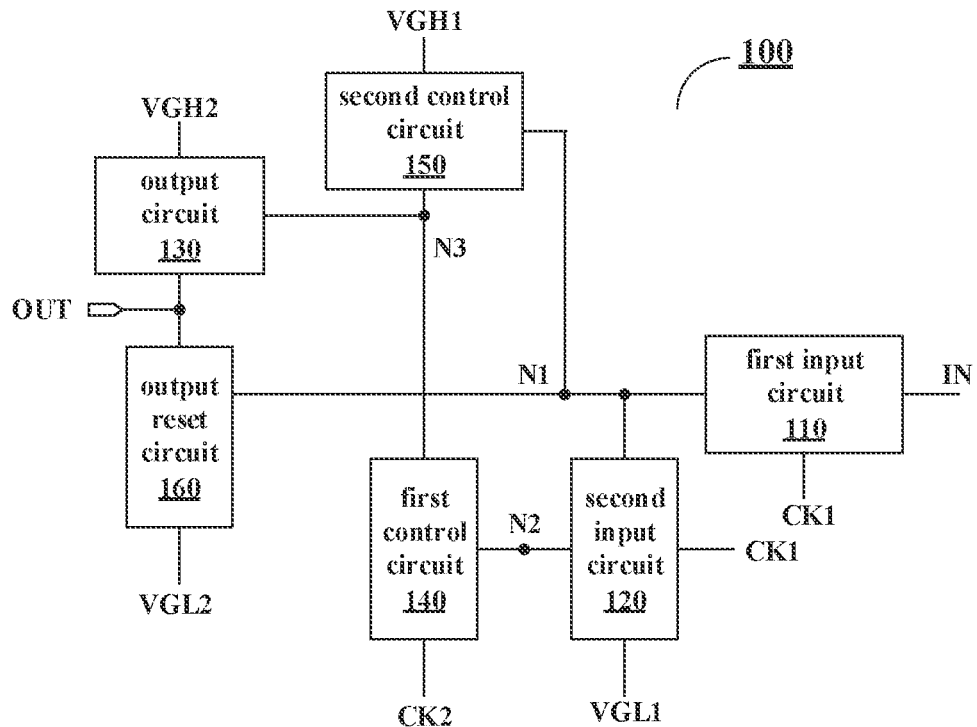
FIG. 3 is a schematic block diagram of a shift register unit provided by some embodiments of the present disclosure.

Some embodiments of the present disclosure provide a shift register unit 100, as shown in FIG. 3, the shift register unit 100 includes a first input circuit 110, a second input circuit 120, an output circuit 130, a first control circuit 140, and a second control circuit 150. A plurality of the shift register units 100 may be cascaded to form a driving circuit for driving a display device, such as an OLED display panel.

The first input circuit 110 is electrically connected to a first node N1, and is configured to transmit an input signal IN to the first node N1 under the control of a first clock signal CK1. For example, the first input circuit 110 is configured to receive the first clock signal CK1 and the input signal IN, so when the first input circuit 110 is turned on under the control of the first clock signal CK1, the input signal IN that is received is transmitted to the first node N1. For example, in the case where a plurality of the shift register units 100 are cascaded to form a driving circuit, the present-stage of the shift register units may receive an output signal of another stage of the shift register units and use the output signal as the input signal IN of the present-stage.

The second input circuit 120 is electrically connected to the first node N1 and a second node N2, and is configured to control a level of the second node N2 under the control of a level of the first node N1 or the first clock signal CK1. For example, the second input circuit 120 is configured to receive the first clock signal CK1, when the second input circuit 120 is turned on under the control of the level of first node N1, the first clock signal CK1 is transmitted to the second node N2, thereby controlling the level of the second node N2. For another example, the second input circuit 120 is further configured to receive a first low voltage VGL1, when the second input circuit 120 is turned on under the control of the first clock signal CK1, the second node N2 is electrically connected to the first low voltage VGL1, thereby controlling the level of the second node N2.

It should be noted that, for example, the first low voltage VGL1 may be a DC low level, which is the same in the following embodiments and will not be described again.

The first control circuit 140 is electrically connected to the second node N2 and a third node N3, and is configured to control a level of the third node N3 under the control of the level of the second node N2 and a second clock signal CK2. For example, the first control circuit 140 is configured to receive the second clock signal CK2, when the first control circuit 140 is turned on under the control of the level of the second node N2 and the second clock signal CK2, the second clock signal CK2 is transmitted to the third node N3, thereby controlling the level of the third node N3.

The output circuit 130 is electrically connected to the third node N3 and an output terminal OUT, and is configured to output an output signal to the output terminal OUT under the control of the level of the third node N3. For example, the output circuit 130 is configured to receive a second high voltage VGH2. When the output circuit 130 is turned on under the control of the level of the third node N3, the second high voltage VGH2 is output to the output terminal OUT as the output signal.

It should be noted that, for example, the second high voltage VGH2 may be a DC high level, which is the same in the following embodiments and will not be described again.

The second control circuit 150 is electrically connected to the first node N1 and the third node N3, and is configured to control the level of the third node N3 under the control of the level of the first node N1. For example, the second control circuit 150 is configured to receive a first high voltage VGH1, and when the second control circuit 150 is turned on under the control of the level of the first node N1, the first high voltage VGH1 is transmitted to the third node N3, thereby controlling the level of the third node N3.

It should be noted that, for example, the first high voltage VGH1 may be a DC high level, which is the same in the following embodiments and will not be described again.

The output signal of the shift register unit provided by some embodiments of the present disclosure may be provided as a light-emitting control signal to a pixel unit of a display device for controlling a pixel circuit in the pixel unit to emit light. For example, further, the shift register unit provided by some embodiments of the present disclosure can further adjust the pulse width of the output signal by adjusting the input signal IN, so as to control the light-emitting brightness of the pixel unit. How to adjust the pulse width of the output signal will be described below, and will not be repeated here.

As shown in FIG. 3, the shift register unit 100 provided by some embodiments of the present disclosure further includes an output reset circuit 160. The output reset circuit 160 is electrically connected to the first node N1 and the output terminal OUT, and is configured to reset the output terminal OUT under the control of the level of the first node N1. For example, the output reset circuit 160 is configured to receive a second low voltage VGL2. When the output reset circuit 160 is turned on under the control of the level of the first node N1, the second low voltage VGL2 is transmitted to the output terminal OUT, that is, the low-level second low voltage VGL2 can pull down a level of the output terminal OUT, thereby implementing a reset operation on the output terminal OUT.

It should be noted that, for example, the second low voltage VGL2 may be a DC low level, which is the same in the following embodiments and will not be described again.

Figure 4:
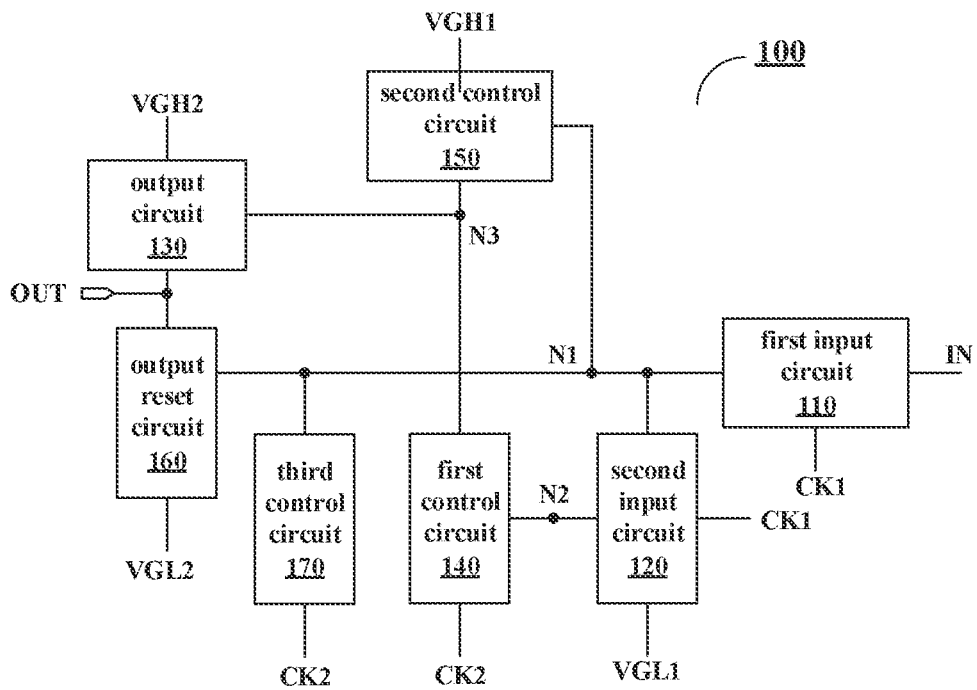
FIG. 4 is a schematic block diagram of another shift register unit provided by some embodiments of the present disclosure.

As shown in FIG. 4, the shift register unit 100 provided by some embodiments of the present disclosure further includes a third control circuit 170. The third control circuit 170 is electrically connected to the first node N1, and is configured to adjust, by coupling, the level of the first node N1 under the control of the level of the first node N1. For example, the third control circuit 170 is configured to receive the second clock signal CK2. For example, the third control circuit 170 may include a capacitor. When the second clock signal CK2 changes, the change value of a level of the second clock signal CK2 adjusts, by coupling, the level of the first node N1 through the capacitor. For example, when the second clock signal CK2 changes from a high level to a low level, the third control circuit 170 can pull down, by coupling, the level of the first node N1, so the level of the first node N1 becomes lower, thereby causing the output reset circuit 160 to achieve a better reset operation on the output terminal OUT under the control of the level of the first node N1.

In the shift register unit provided by some embodiments of the present disclosure, by providing the third control circuit 170, the level of the first node N1 can be pulled down, by coupling, to improve a driving reset capability of the output reset circuit 160, so the output terminal OUT can output a low level without a threshold loss when it is not necessary to output a high level, thereby improving the contrast of the display panel, and improving the display effect of the display panel.

It should be noted that, in some embodiments of the present disclosure, the first low voltage VGL1 and the second low voltage VGL2 each are a DC low level, for example, the level values of the first low voltage VGL1 and the second low voltage VGL2 may be the same or different. The first high voltage VGH1 and the second high voltage VGH2 are both a DC high level, for example, the level values of the first high voltage VGH1 and the second high voltage VGH2 may be the same or different.

Figure 5:
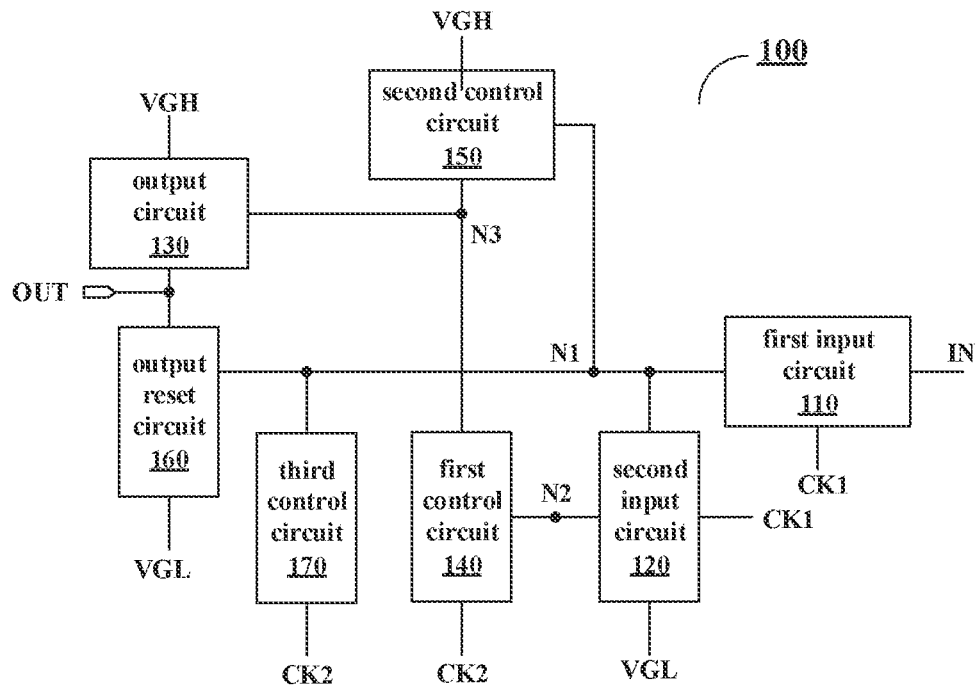
FIG. 5 is a schematic block diagram of still another shift register unit provided by some embodiments of the present disclosure.

For example, as shown in FIG. 5, in the shift register unit 100 provided by some embodiments of the present disclosure, the second input circuit 120 and the output reset circuit 160 are configured to receive a same first voltage VGL, for example, the first voltage VGL is a DC low level. The output circuit 130 and the second control circuit 150 are configured to receive a same second voltage VGH, for example, the second voltage VGH is a DC high level. It should be noted that, for the same parts in FIG. 5 and FIG. 4, reference may be made to the corresponding descriptions in the foregoing embodiments, and details are not described herein again.

Figure 6:
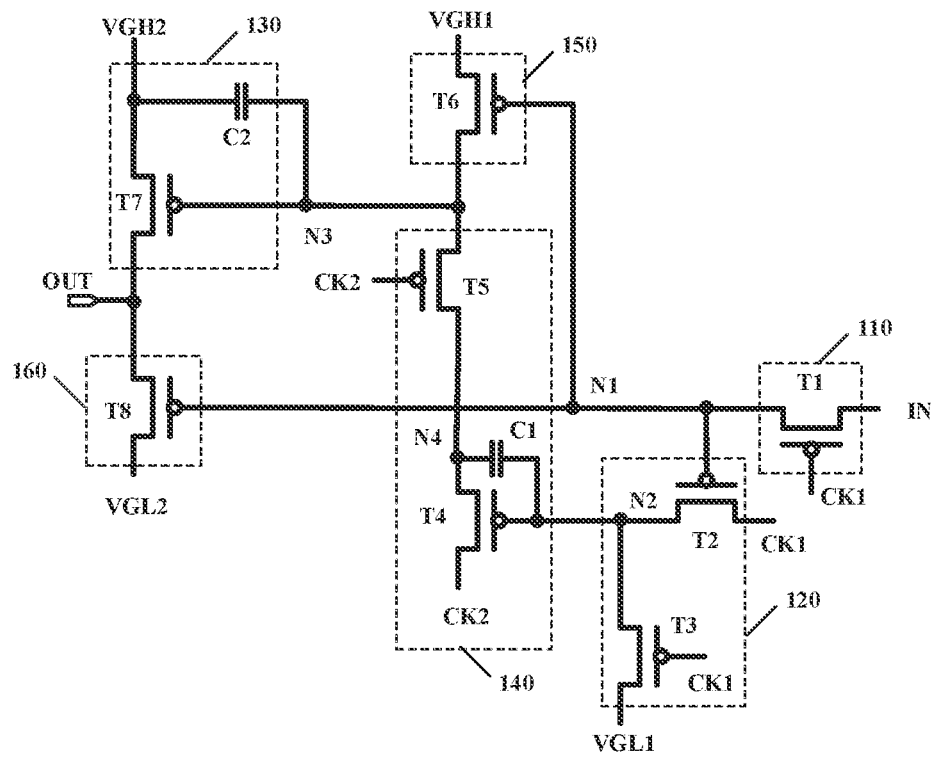
FIG. 6 is a schematic circuit diagram of an implementation example of the shift register unit as shown in FIG. 3.

In some embodiments of the present disclosure, the shift register unit 100 as shown in FIG. 3 may be implemented as the circuit structure as shown in FIG. 6. It should be noted that the transistors as shown in FIG. 6 are all described by taking P-type transistors as an example, an active level of a P-type transistor is a low level, and an inactive level of the P-type transistor is a high level.

It should be noted that the "active level" in the embodiments of the present disclosure refers to the level that is capable of turning on a transistor that is operated, and the corresponding "inactive level" refers to the level that is not capable of turning on the transistor that is operated (that is, the transistor is turned off). For example, in some embodiments of the present disclosure, in the case where the transistor is a P-type transistor, the active level is a low level, the inactive level is a high level, and the inactive level is higher than the active level. In the case where the transistor is an N-type transistor, the active level is high level, the inactive level is a low level, and the inactive level is lower than the active level.

In addition, it should be noted that in the embodiments of the present disclosure, the high level and the low level are described relative to each other. The high level represents a relatively higher voltage range (for example, the high level may adopt 5V, 10V, or other appropriate voltage), and multiple high levels may be same or different. Similarly, the low level represents a lower voltage range (for example, the low level may adopt 0V, −5V, −10V, or other appropriate voltage), and multiple low levels can be same or different. For example, the minimum value of the high level is greater than the maximum value of the low level.

As shown in FIG. 6, the first input circuit 110 is implemented as a first transistor T1. A gate electrode of the first transistor T1 is configured to receive the first clock signal CK1, a first electrode of the first transistor T1 is configured to receive the input signal IN, and a second electrode of the first transistor T1 is electrically connected to the first node N1. For example, when the first clock signal CK1 is at a low level, the first transistor T1 is turned on, so the input signal IN is transmitted to the first node N1.

As shown in FIG. 6, the second input circuit 120 is implemented to include a second transistor T2 and a third transistor T3. A gate electrode of the second transistor T2 is electrically connected to the first node N1, a first electrode of the second transistor T2 is configured to receive the first clock signal CK1, and a second electrode of the second transistor T2 is electrically connected to the second node N2. For example, when the first node N1 is at a low level, the second transistor T2 is turned on, so the first clock signal CK1 is transmitted to the second node N2.

A gate electrode of the third transistor T3 is configured to receive the first clock signal CK1, a first electrode of the third transistor T3 is configured to receive the first low voltage VGL1, and a second electrode of the third transistor T3 is electrically connected to the second node N2. For example, when the first clock signal CK1 is at a low level, the third transistor T3 is turned on, so the second node N2 is electrically connected to the first low voltage VGL1, thereby pulling down the level of the second node N2. The level of the second node N2 can be controlled by a combined action of the second transistor T2 and the third transistor T3, thereby controlling the first control circuit 140.

As shown in FIG. 6, the first control circuit 140 is implemented to include a fourth transistor T4, a fifth transistor T5, and a first capacitor C1.

A gate electrode of the fourth transistor T4 is electrically connected to the second node N2, a first electrode of the fourth transistor T4 is configured to receive the second clock signal CK2, and a second electrode of the fourth transistor T4 is electrically connected to a fourth node N4. A gate electrode of the fifth transistor T5 is configured to receive the second clock signal CK2, a first electrode of the fifth transistor T5 is electrically connected to the fourth node N4, and a second electrode of the fifth transistor T5 is electrically connected to the third node N3. A first electrode of the first capacitor C1 is electrically connected to the second node N2, and a second electrode of the first capacitor C1 is electrically connected to the fourth node N4.

For example, when the level of the second node is at a low level and the second clock signal CK2 is at a low level, the fourth transistor T4 and the fifth transistor T5 are turned on, so the second clock signal CK2 is transmitted to the third node N3, thereby implementing the control to the level of the third node N3. In the shift register unit 100 provided in the embodiment of the present disclosure, the first capacitor C1 is used to store the level of the second node N2.

As shown in FIG. 6, the second control circuit 150 is implemented as a sixth transistor T6. A gate electrode of the sixth transistor T6 is electrically connected to the first node N1, a first electrode of the sixth transistor T6 is configured to receive the first high voltage VGH1, and a second electrode of the sixth transistor T6 is electrically connected to the third node N3. For example, when the level of the first node N1 is at a low level, the sixth transistor T6 is turned on, so the first high voltage VGH1 with a high level is transmitted to the third node N3, thereby pulling up the level of third node N3.

As shown in FIG. 6, the output circuit 130 is implemented to include a seventh transistor T7 and a second capacitor C2. A gate electrode of the seventh transistor T7 is electrically connected to the third node N3, a first electrode of the seventh transistor T7 is configured to receive the second high voltage VGH2, and a second electrode of the seventh transistor T7 is electrically connected to the output terminal OUT. A first electrode of the second capacitor C2 is electrically connected to the third node N3, and a second electrode of the second capacitor C2 is electrically connected to the first electrode of the seventh transistor T7, that is, the second electrode of the second capacitor C2 is configured to receive the second high voltage VGH2.

For example, when the level of the third node N3 is at a low level, the seventh transistor T7 is turned on, so the seventh transistor T7 outputs the second high voltage VGH2 to the output terminal OUT as the output signal. For example, the output signal may be provided to a pixel circuit in a pixel unit as a light-emitting control signal for controlling, for example, a light-emitting control transistor in the pixel circuit. In the shift register unit 100 provided in the embodiment of the present disclosure, the second capacitor C2 is used to store the level of the third node N3.

As shown in FIG. 6, the output reset circuit 160 is implemented as an eighth transistor T8. A gate electrode of the eighth transistor T8 is electrically connected to the first node N1, a first electrode of the eighth transistor T8 is configured to receive the second low voltage VGL2, and a second electrode of the eighth transistor T8 is electrically connected to the output terminal OUT. For example, when the level of the first node N1 is at a low level, the eighth transistor T8 is turned on, so the second low voltage VGL2 with a low level pulls down the level of the output terminal OUT, thereby implementing a reset operation on the output terminal OUT.

Figure 7:
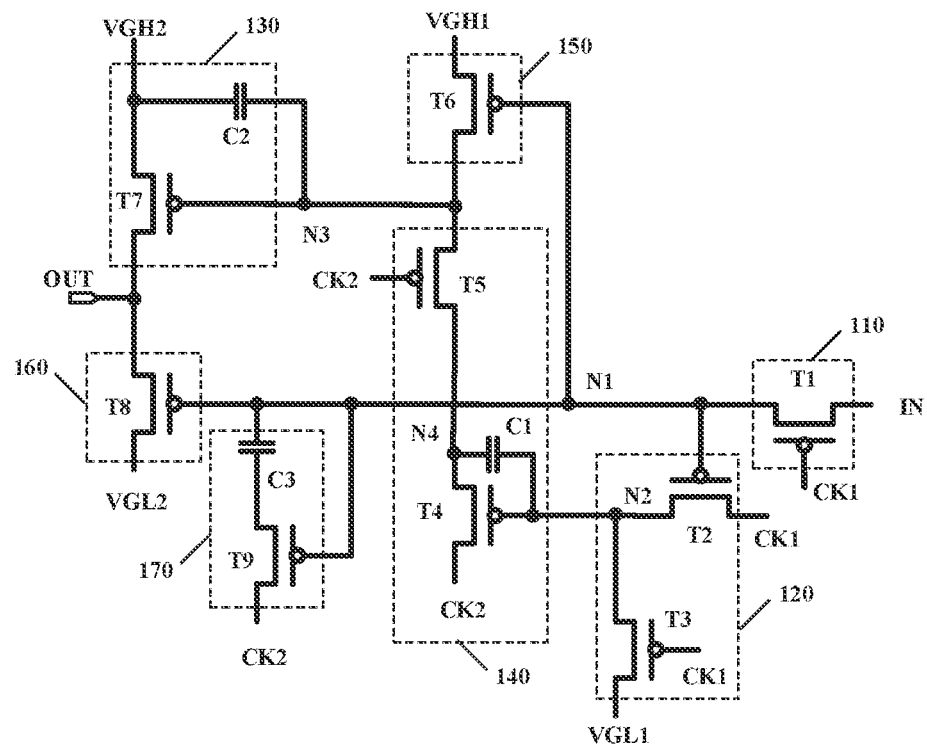
FIG. 7 is a schematic circuit diagram of an implementation example of the shift register unit as shown in FIG. 4.

In some embodiments of the present disclosure, the shift register unit 100 as shown in FIG. 4 may be implemented as the circuit structure as shown in FIG. 7. It should be noted that the transistors as shown in FIG. 7 are all described by taking P-type transistors as an example, an active level of a P-type transistor is a low level, and an inactive level of the P-type transistor is a high level.

As shown in FIG. 7, the third control circuit 170 is implemented to include a ninth transistor T9 and a third capacitor C3. A gate electrode of the ninth transistor T9 is electrically connected to the first node N1, a first electrode of the ninth transistor T9 is configured to receive the second clock signal CK2, a second electrode of the ninth transistor T9 is electrically connected to a first electrode of the third capacitor C3, and a second electrode of the third capacitor C3 is electrically connected to the first node N1.

For example, when the first node N1 is at a low level, the ninth transistor T9 is turned on. At this time, if the second clock signal CK2 changes from a high level to a low level, that is, the first electrode of the third capacitor C3 changes from a high level to a low level, then according to the characteristics of the capacitor itself (the difference between two electrodes of the capacitor will not change abruptly), the change of the level of the first electrode of the third capacitor C3 adjusts, by coupling, the level of the second electrode of the third capacitor C3 through the third capacitor C3, thereby reducing the level of the second electrode (that is, the first node N1) of the third capacitor C3.

In the shift register unit 100 provided by the embodiments of the present disclosure, by proving the ninth transistor T9 and the third capacitor C3, when the first node N1 is at a low level, the level of the first node N1 can be further adjusted by coupling; thus the level of the first node N1 is further reduced based on the original low level, so the eighth transistor T8 is turned on more sufficiently (that is, the driving reset capability of the output reset circuit 160 is improved), the eighth transistor T8 provides the second low voltage VGL2 with a low level to the output terminal OUT without a threshold loss, and the output terminal OUT outputs a low level without a threshold loss when it is not necessary to output a high level, thereby improving the contrast of the display panel, and improving the display effect of the display panel.

It should be noted that, for other parts in FIG. 7, reference may be made to corresponding descriptions in the embodiment as shown in FIG. 6, and details are not described herein again.

Figure 8:
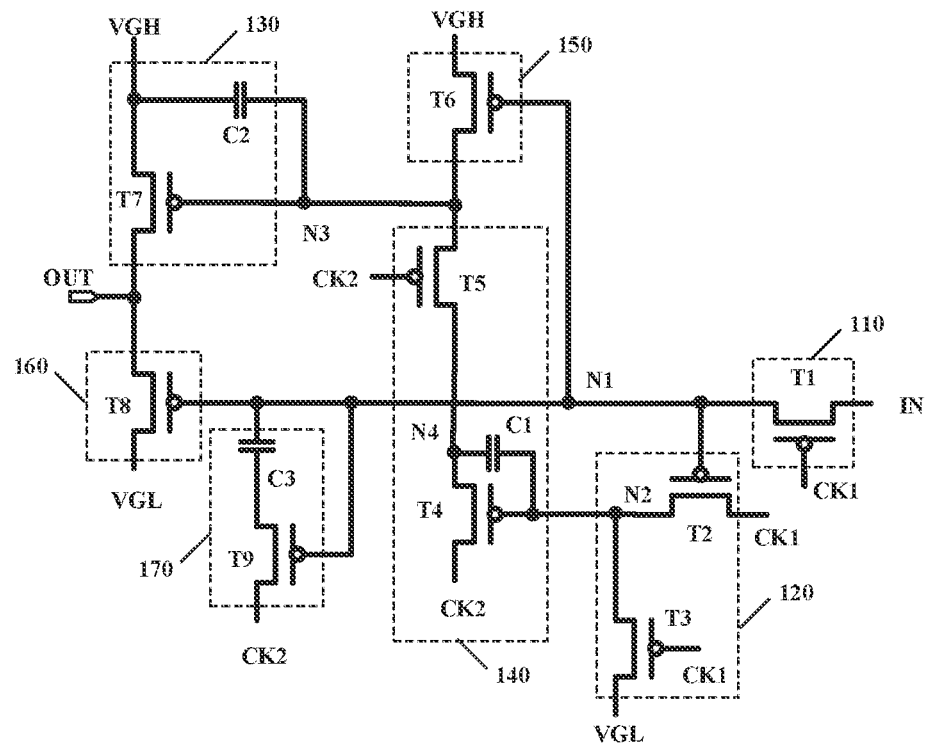
FIG. 8 is a schematic circuit diagram of an implementation example of the shift register unit as shown in FIG. 5.

In some embodiments of the present disclosure, the shift register unit 100 as shown in FIG. 5 may be implemented as the circuit structure as shown in FIG. 8. It should be noted that the transistors as shown in FIG. 8 are all described by taking P-type transistors as an example. The active level of a P-type transistor is a low level, and the inactive level of the P-type transistor is a high level.

As shown in FIG. 8, the first electrode of the third transistor T3 is configured to receive the first voltage VGL, the first electrode of the eighth transistor T8 is configured to receive the first voltage VGL, the first electrode of the sixth transistor T6 is configured to receive the second voltage VGH, and the first electrode of the seventh transistor T7 is configured to receive the second voltage VGH. It should be noted that, for other parts in FIG. 8, reference may be made to corresponding descriptions in the embodiments as shown in FIG. 6 and FIG. 7, and details are not described herein again.

Figure 9:
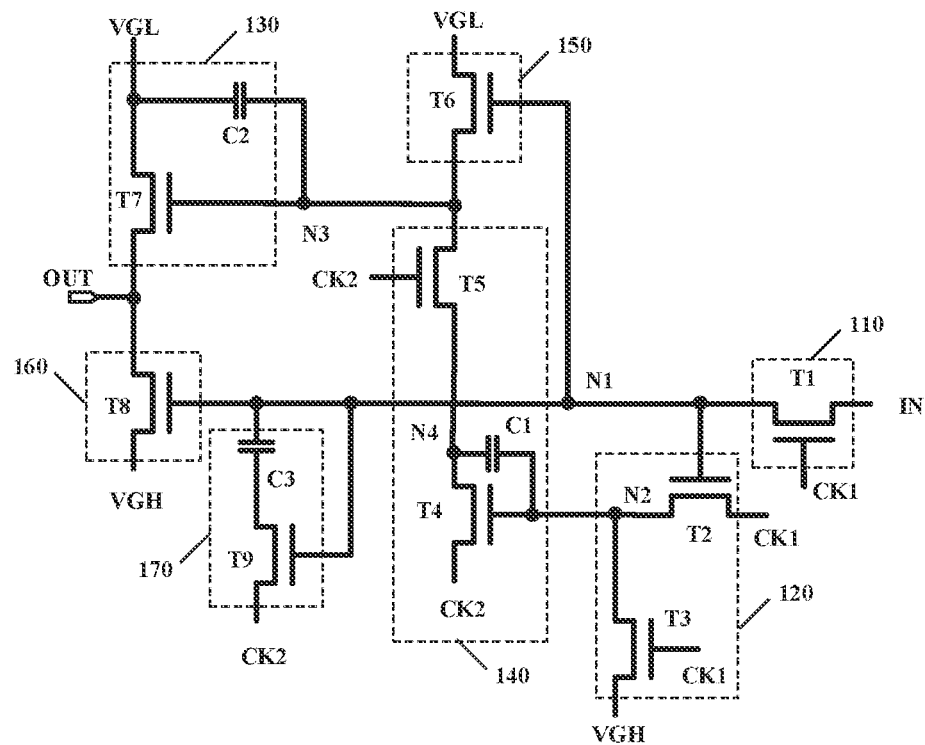
FIG. 9 is a schematic circuit diagram of a shift register unit provided by some embodiments of the present disclosure.

Some embodiments of the present disclosure further provide a shift register unit 100, as shown in FIG. 9, unlike the shift register unit provided in other embodiments, the transistors in the shift register unit as shown in FIG. 9 all adopt N-type transistors. Only different parts of the shift register unit as shown in FIG. 9 and the shift register unit as shown in FIG. 8 will be described below.

As shown in FIG. 9, the first electrode of the third transistor T3 is configured to receive the second voltage VGH, the first electrode of the eighth transistor T8 is configured to receive the second voltage VGH, the first electrode of the sixth transistor T6 is configured to receive the first voltage VGL, and the first electrode of the seventh transistor T7 is configured to receive the first voltage VGL. It should be noted that, in the embodiment as shown in FIG. 9, the third transistor T3 and the eighth transistor T8 may also be configured to receive different high-level voltages, for example, one of them receives the first high voltage VGH1 and the other receives the second high voltage VGH2. The sixth transistor T6 and the seventh transistor T7 may also be configured to receive different low-level voltages, for example, one of them receives the first low voltage VGL1 and the other receives the second low voltage VGL2.

It should be noted that the transistors in the embodiments of the present disclosure may adopt thin film transistors, field-effect transistors or other switching devices with the required characteristics. In the embodiments of the present disclosure, thin film transistors are adopted as an example for description. Source electrodes and drain electrodes of the transistors adopted herein can be symmetrical in structure, so the source electrodes and drain electrodes are not different in structure. In the embodiment of the present disclosure, in order to distinguish between the two electrodes of a transistor other than a gate electrode, it is directly described that one of the two electrodes is a first electrode and the other electrode is a second electrode.

Figure 10:
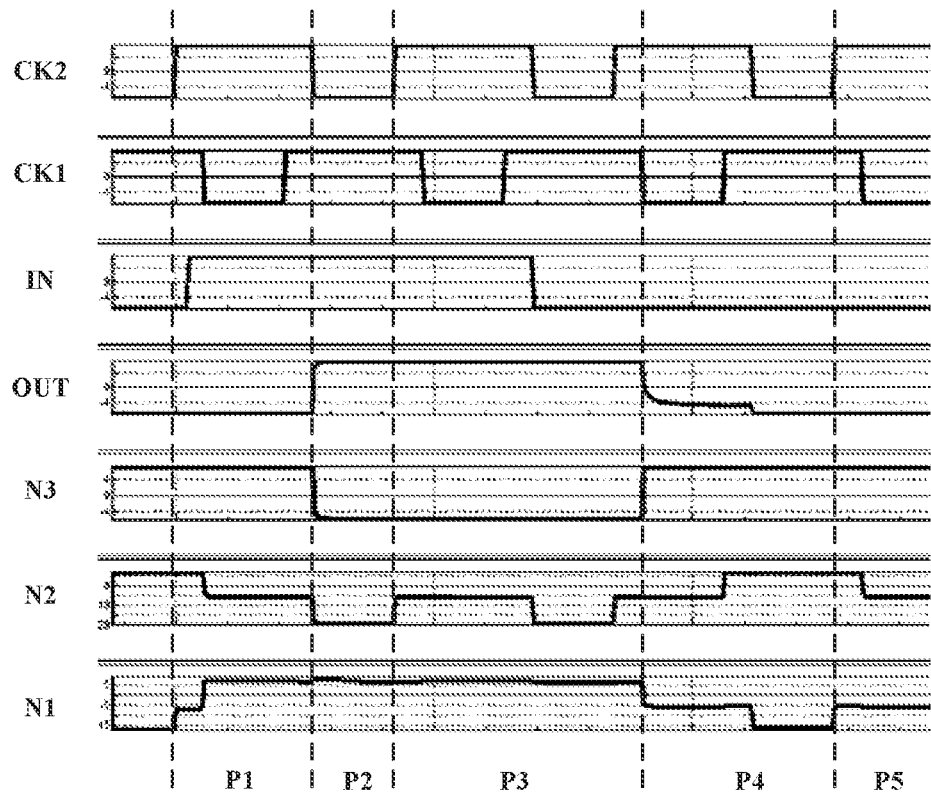
FIG. 10 is a signal timing diagram corresponding to the operation of the pixel circuit as shown in FIG. 8.

The working principle of the shift register unit 100 as shown in FIG. 8 will be described below with reference to the signal timing diagram as shown in FIG. 10. It should be noted that the level values of signals as shown in FIG. 10 are schematic and do not represent true level values. In a preliminary stage P1, a pull-up stage P2, a high-potential maintenance stage P3, a pull-down stage P4, and a low-potential maintenance stage P5 as shown in FIG. 10, the shift register unit 100 as shown in FIG. 8 performs the following operations.

In the preliminary stage P1, the second clock signal CK2 changes from a low level to a high level. Because the first node N1 is at a low level before the preliminary stage P1, the ninth transistor T9 is turned on, and the change of the level value of the second clock signal CK2 is coupled to the first node N1 through the third capacitor C3, so the level of the first node N1 will increase by a small amount at the beginning of the preliminary stage P1. Then the input signal IN changes from a low level to a high level, the first clock signal CK1 changes from a high level to a low level, and the first transistor T1 is turned on by the first clock signal CK1 with a low level, so the input signal IN with a high level is transmitted to the first node N1, and the level of the first node N1 is further pulled up to a high level.

In addition, the third transistor T3 is turned on by the first clock signal CK1 with a low level, and the third transistor T3 transmits the low-level first voltage VGL to the second node N2. Because the P-type transistor T3 has a threshold loss when transmitting the first voltage VGL, the level of the second node N2 is pulled down to $V_{GL}+|Vth|$, $V_{GL}$ represents the level value of the first voltage VGL, and Vth represents the threshold voltage of the third transistor T3. The fourth transistor T4 is turned on by the low level of the second node N2, and the fourth transistor T4 transmits the second clock signal CK2 with a high level to the fourth node N4. For example, the high level of the second clock signal CK2 is VGH, so the potential difference between the two electrodes of the first capacitor C1 is $V_{GH}-V_{GL}-|Vth|$. In a last period of the preliminary stage P1, the first clock signal CK1 is changed from a low level to a high level, so the first transistor T1 and the third transistor T3 are turned off.

In the pull-up stage P2, the second clock signal CK2 is changed from a high level to a low level, and the first clock signal CK1 is at a high level. Due to the storage effect of the first capacitor C1, the fourth transistor T4 remains on, so the level of the fourth node N4 will be pulled down by the low-level second clock signal CK2. Because the potential difference between the two electrodes of the first capacitor C1 cannot be abruptly changed, compared with the preliminary stage P1, the level of the second node N2 in the pull-up stage P2 is pulled down, by coupling, to a lower level, so the fourth transistors T4 is turned on more sufficiently. In addition, the fifth transistor T5 is turned on by the low-level second clock signal CK2, so the low-level second clock signal CK2 pulls down the level of the third node N3, and the seventh transistor T7 is turned on by the low level of the third node N3, thereby the seventh transistor T7 outputs the second voltage VGH with a high level to the output terminal OUT, that is, the level of the output terminal OUT is pulled up to the second voltage VGH.

In the high-potential maintenance stage P3, because the second node N2 is kept at a low level, the fourth transistor T4 remains on. When the second clock signal CK2 changes, this change is transmitted to the second node N2 by the coupling effect of the first capacitor C1, so in the high-potential maintenance stage P3, the level of the second node N2 changes with the change of the second clock signal CK2. For example, when the second clock signal CK2 changes from a low level to a high level, the level of the second node N2 increases. When the second clock signal CK2 changes from a high level to a low level, the level of the second node N2 decreases.

In addition, in the high-potential maintenance stage P3, when the first clock signal CK1 is at a low level, the input signal IN remains at a high level. At this time, the first transistor T1 is turned on by the low level of the first clock signal CK1, so the first node N1 remains at a high level. It should be noted that in the stage P3, as long as the input signal IN remains high when the first clock signal CK1 is at a low level, the first node N1 will remain at a high level and the eighth transistor T8 remains the state of being turned off, so the output terminal OUT remains at a high level without being pulled down. In addition, it should be noted that before the pull-down stage P4, the input signal IN is changed from a high level to a low level.

In the pull-down stage P4, when the first clock signal CK1 changes from a high level to a low level, the input signal IN is at a low level, the first transistor T1 is turned on, and the input signal IN with a low level is transmitted to the first node N1, so the level of the first node N1 drops to a low level. The eighth transistor T8 is turned on by the low level of the first node N1, so the output signal output from the output terminal OUT is pulled down by the first voltage VGL with a low level. In addition, the sixth transistor T6 is also turned on by the low level of the first node N1, so the level of the third node N3 is pulled up by the second voltage VGH with a high level, and the seventh transistor T7 is turned off.

In addition, in the pull-down stage P4, the ninth transistor T9 is turned on by the low level of the first node N1. When the second clock signal CK2 changes from a high level to a low level, the coupling effect of the third capacitor C3 causes the level of the first node N1 to be further pulled down on the basis of a low level, so the eighth transistor T8 is turned on more sufficiently. The eighth transistor T8 provides the first voltage VGL with a low level to the output terminal OUT without a threshold loss, so the output terminal OUT outputs a low level without a threshold loss when it is not necessary to output a high level, thereby improving the contrast of the display panel, and improving the display effect of the display panel.

In the low-potential maintenance stage P5, the input signal IN is maintained at a low level, the first node N1 is maintained at a low level, and the third node N3 is maintained at a high level, so the output signal output from the output terminal OUT may be well maintained at a low level.

Also in the low-potential maintenance stage P5, due to the effect of the ninth transistor T9 and the third capacitor C3, the level of the first node N1 will change with the change of the second clock signal CK2. For example, when the second clock signal CK2 changes from a low level to a high level, the level of the first node N1 is pulled up slightly (still remains at a low level), and when the second clock signal CK2 changes from a high level to low level, the level of the first node N1 is pulled down to a low level.

In addition, in the pull-down stage P4 and the low-potential maintenance stage 135, the second transistor T2 is also turned on by the low level of the first node N1, so the first clock signal CK1 is transmitted to the second node N2, and the level of the second node N2 will change with the change of the first clock signal CK1. For example, when the first clock signal CK1 changes from a low level to a high level, the level of the second node N2 is pulled up to a high level, and when the first clock signal CK1 changes from a high level to a low level, the level of the second node N2 is pulled down to a low level.

In the shift register unit provided by some embodiments of the present disclosure, by providing the second transistor T2 such that in the pull-down stage P4 and the low-potential maintenance stage 135, the fourth transistor T4 can remain the state of being turned off when the second clock signal CK2 is at a low level, so the low-level second clock signal CK2 is prevented from being transmitted to the third node N3, which can prevent the level of the third node N3 from being pulled down, and thus prevent the seventh transistor T7 from being turned on to cause an abnormal output at the output terminal OUT.

In the shift register unit provided by some embodiments of the present disclosure, the level of the third node N3 may be well controlled by providing the first control circuit 140. The first control circuit 140 includes, for example, the fourth transistor T4, the fifth transistor T5, and the first capacitor C1. The first control circuit 140 can implement the function of controlling the level of the third node N3 by using the two transistors and the one capacitor, so the circuit structure of the shift register unit can be simplified, and the number of transistors can be saved. For example, when the output terminal OUT of the shift register unit needs to provide the output signal, the level of the third node N3 needs to be maintained at a low level and cannot be pulled up. In this way, the seventh transistor T7 can be turned on more sufficiently, thereby ensuring that the output terminal OUT can normally provide the output signal. And in the high-potential maintenance stage P3, even when the fourth transistor T4 is turned on, and when the second clock signal CK2 is at a high level, because the fifth transistor T5 is turned off by the high level of the second clock signal CK2, the high level of the second clock signal CK2 cannot affect the third node N3 through the fourth transistor T4 and the fifth transistor T5, so the third node N3 can be maintained at a low level.

For example, as shown in FIG. 10, the duty cycle of the first clock signal CK1 and the duty cycle of the second clock signal CK2 are both greater than 50%. In this way, the first clock signal CK1 and the second clock signal CK2 cannot be at a low level at the same time, so the output abnormality of the shift register unit can be avoided. For example, when the first clock signal CK1 and the second clock signal CK2 are both at a low level, the first transistor T1 and the third transistor T3 are turned on, the second node N2 is pulled down to a low level, the fourth transistor T4 is turned on, and in addition, the fifth transistor T5 is turned on by the low level of the second clock signal CK2, so the third node N3 is pulled down to a low level, and the seventh transistor is turned on. If the input signal IN is at a low level at this time, the first node N1 is pulled down to a low level, so the eighth transistor T8 is turned on. When the seventh transistor T7 and the eighth transistor T8 are turned on simultaneously, the output signal output from the output terminal OUT cannot be determined, that is, an output abnormality occurs.

In some embodiments of the present disclosure, the pulse width of the output signal output from the output terminal OUT can be adjusted by adjusting the pulse width of the input signal IN. For example, in some embodiments, as shown in FIG. 10, the duty cycle of the first clock signal CK1 and the duty cycle of the second clock signal CK2 are both greater than 50%, and the periods of the first clock signal CK1 and the second clock signal CK2 are the same. For example, as shown in FIG. 10, the periods of the first clock signal CK1 and the second clock signal CK2 are both the sum of the durations of the preliminary stage P1 and the pull-up stage P2.

For example, as shown in FIG. 10, the pulse width of the output signal output from the output terminal OUT is the sum of the durations of the pull-up stage P2 and the high-potential maintenance stage P3. For example, in the high-potential maintenance stage P3, in the case where the pulse width of the output signal needs to be increased, the high level of the input signal IN can be maintained to a time point, in a next period of the first clock signal CK1, when the first clock signal CK1 is at a high level, and in this way, the pulse width of the output signal can be extended by one period of the first clock signal CK1. For example, in the case where the output terminal OUT needs to output a low level, the input signal IN is adjusted to a low level. When the first clock signal CK1 becomes a low level in the subsequent timing, the output signal output from the output terminal OUT is pulled down to a low level to adjust the pulse width of the output signal.

Figure 11:
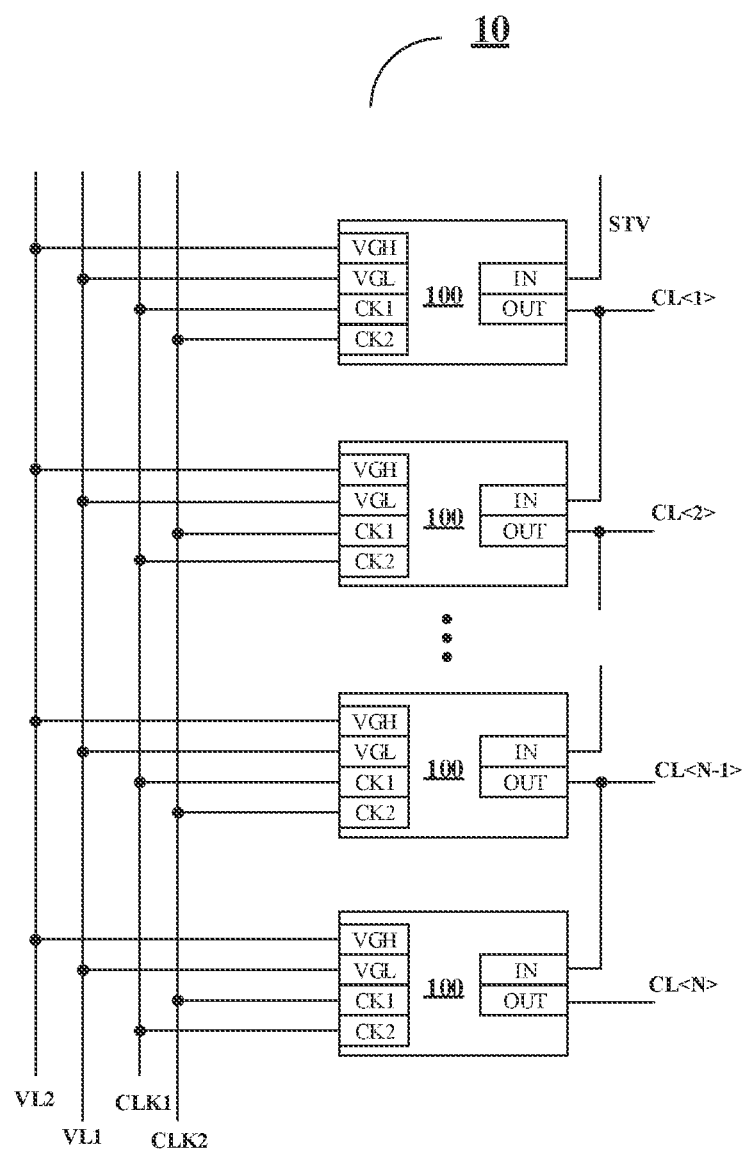
FIG. 11 is a schematic diagram of a driving circuit provided by some embodiments of the present disclosure.

Some embodiments of the present disclosure further provide a driving circuit 10. As shown in FIG. 11, the driving circuit 10 includes a plurality of cascaded shift register units 100, for example, the shift register unit 100 may adopt any one of the shift register units provided in the above embodiments. The driving circuit 10 may be directly integrated on the array substrate of the display device by using the processes similar to those for forming a thin film transistor.

It should be noted that the shift register unit 100 in FIG. 11 is illustrated by using the shift register unit as shown in FIG. 8 as an example.

For example, as shown in FIG. 11, except the first-stage of the shift register units, any one of the shift register units of other stages is connected with the output terminal of a shift register unit of a preceding stage before the any one of the shift register units of other stages, so the output signal of the shift register unit of the preceding stage is used as the input signal IN of the present-stage of the shift register units. For example, the first-stage of the shift register units may be configured to receive a trigger signal STV and use the trigger signal STV as the input signal IN.

For example, the driving circuit 10 provided by some embodiments of the present disclosure may be used to drive the pixel circuits in pixel units in a display panel, for example, which can be referred to the pixel circuit as shown in FIG. 1, but the embodiments of the present disclosure are not limited thereto. For example, each pixel circuit includes a light-emitting control transistor, and control terminals (for example, gate electrodes) of the light-emitting control transistors in the pixel circuits in a same row of pixel units are electrically connected to a same light-emitting control line. As shown in FIG. 11, the output terminal OUT of the first-stage of the shift register units is electrically connected to a light-emitting control line CL<1> for the first row of pixel units, the output terminal OUT of the second-stage of the shift register units is electrically connected to a light-emitting control line CL<2> for the second row of pixel units, the output terminal OUT of the (N−1)th-stage of the shift register units is electrically connected to a light-emitting control line CL<N−1> for the (N−1)th row of pixel units, and the output terminal OUT of the (N)th-stage of the shift register units is electrically connected to a light-emitting control line CL<N> for the (N)th row of pixel units. The output signals of the shift register units 100 in the driving circuit 10 are transmitted to the control terminals of the light-emitting control transistors in the pixel circuits through the light-emitting control lines, thereby controlling the light-emitting control transistors. For example, the time during which the light-emitting control transistor is turned on can be controlled by adjusting the pulse width of the output signal of the shift register unit, thereby controlling the light-emitting brightness of the corresponding pixel unit.

It should be noted that the driving circuit provided by the embodiment of the present disclosure is not limited to drive the pixel circuit in the display panel, and can further be used in any other scene that requires a control signal, and the method provided by the embodiments of the present disclosure can further adjust the pulse width of the control signal to meet various requirements.

For example, as shown in FIG. 11, the driving circuit 10 further includes a first clock signal line CLK1 and a second clock signal line CLK2. For example, the first clock signal line CLK1 and the second clock signal line CLK2 are electrically connected to a timing controller (T-con), respectively. For example, the (2n−1)th-stage of the shift register units is electrically connected to the first clock signal line CLK1 to receive the first clock signal CK1, and the (2n−1)th-stage of the shift register units is electrically connected to the second clock signal line CLK2 to receive the second clock signal CK2; and the (2n)th-stage of the shift register units is electrically connected to the second clock signal line CLK2 to receive the first clock signal CK1, and the (2n)th-stage of the shift register units is electrically connected to the first clock signal line CLK1 to receive the second clock signal CK2. Here n is an integer greater than zero.

For example, as shown in FIG. 11, the driving circuit 10 further includes a first voltage signal line VL1 and a second voltage signal line VL2, and the first voltage signal line VL1 and the second voltage signal line VL2 are respectively electrically connected to a power management circuit to receive the first voltage VGL and the second voltage VGH respectively. For example, the first voltage signal line VL1 is electrically connected to each stage of the shift register units to provide the first voltage VGL; and the second voltage signal line VL2 is electrically connected to each stage of the shift register units to provide the second voltage VGH. It should be noted that, in different examples, according to different configurations, more voltage signal lines may be used to provide more voltage signals. For example, in the case where the shift register units 100 in the driving circuit 10 are configured to receive the first low voltage VGL1, the second low voltage VGL2, the first high voltage VGH1, and the second high voltage VGH2, four voltage signal lines need to be provided to provide four voltage signals.

The technical effects of the driving circuit 10 provided in the embodiments of the present disclosure can refer to the corresponding descriptions of the shift register units 100 in the embodiments of the present disclosure, and details are not described here again.

Figure 12:
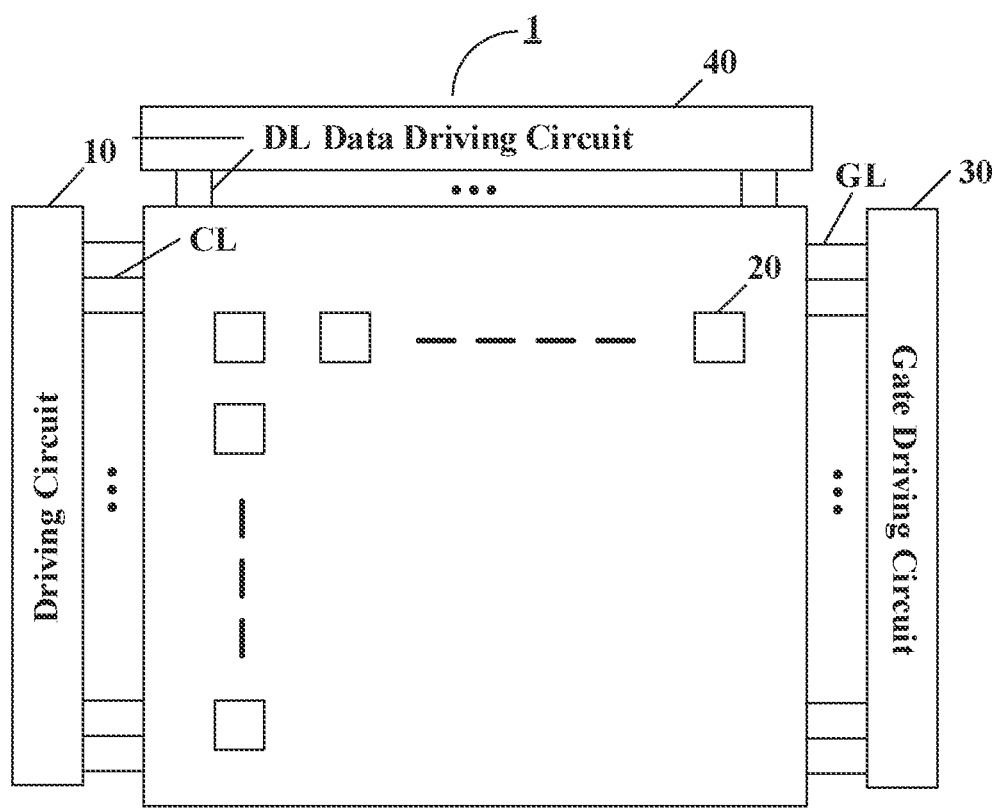
FIG. 12 is a schematic block diagram of a display device provided by some embodiments of the present disclosure.

At least one embodiment of the present disclosure further provides a display device 1, as shown in FIG. 12, the display device 1 includes any one of the driving circuits 10 provided by the embodiments of the present disclosure.

In some embodiments, as shown in FIG. 12, the display device 1 may further include a plurality of pixel units 20 arranged in an array, the plurality of pixel units 20 form a pixel array, and each of the plurality of pixel units 20 includes a pixel circuit, for example, the pixel circuit as shown in FIG. 1. As shown in FIG. 1, in an example, the pixel circuit includes a data writing sub-circuit 11, a driving sub-circuit 12, and a light-emitting control sub-circuit 13. For example, the output terminal of the (n)th-stage of the shift register units in the driving circuit 10 is electrically connected to the control terminals of the light-emitting control sub-circuits in the pixel circuits in the (n)th row of the pixel units, and n is an integer greater than zero. For example, the display device 1 further includes a plurality of light-emitting control lines CL, and the driving circuit 10 is electrically connected to the control terminals (for example, gate electrodes of the light-emitting control transistors) of the light-emitting control sub-circuits in the pixel circuits through the plurality of light-emitting control lines CL.

For example, as shown in FIG. 12, the display device 1 further includes a gate driving circuit 30 and a data driving circuit 40. The gate driving circuit 30 is used to provide gate scanning signals to the pixel array. For example, the gate driving circuit 30 is electrically connected to rows of pixel units through a plurality of gate lines GL, respectively. The data driving circuit 40 is configured to provide data signals to the pixel array. For example, the data driving circuit 40 is electrically connected to columns of pixel units through a plurality of data lines DL.

In the embodiment as shown in FIG. 12, the gate driving circuit 30 and the driving circuit 10 are provided on different sides of the display device 1, and the embodiments of the present disclosure include but are not limited thereto. For example, the gate driving circuit 30 and the driving circuit 10 may also be provided on a same side of the display device 1.

It should be noted that the display device 1 in the present embodiment may be a liquid crystal panel, a liquid crystal television, a display, an OLED panel, an OLED television, an electronic paper, a mobile phone, a tablet computer, a notebook computer, a digital photo frame, a navigator and other products or members having display function. The display device 1 further includes other conventional members, such as a display panel, which are not limited by the embodiments of the present disclosure.

For the technical effects of the display device 1 provided by the embodiments of the present disclosure, reference may be made to the corresponding descriptions of the shift register unit 100 and the driving circuit 10 in the above embodiments, and details are not described here again.

At least one embodiment of the present disclosure further provides a driving method that can be used to drive any of the shift register units 100 provided in the embodiments of the present disclosure. The driving method includes adjusting the pulse width of the output signal by adjusting the pulse width of the input signal IN.

For example, in the driving method provided by the embodiment of the present disclosure, the duty cycle of the first clock signal CK1 and the duty cycle of the second clock signal CK2 are both greater than 50%.

It should be noted that, for the detailed descriptions and technical effects of the driving method, reference may be made to the descriptions of the working principle of the shift register unit 100 in the related embodiments of the present disclosure, and details are not described here again.

What have been described above are only specific implementations of the present disclosure, the protection scope of the present disclosure is not limited thereto. The protection scope of the present disclosure should be based on the protection scope of the claims.

What is claimed is:

1. A shift register unit, comprising a first input circuit, a second input circuit, an output circuit, a first control circuit, and a second control circuit,
   wherein the first input circuit is electrically connected to a first node, and is configured to transmit an input signal to the first node under control of a first clock signal;
   the second input circuit is electrically connected to the first node and a second node, and is configured to control a level of the second node under control of a level of the first node or the first clock signal;
   the first control circuit is electrically connected to the second node and a third node, and is configured to control a level of the third node under control of the level of the second node and a second clock signal;
   the output circuit is electrically connected to the third node, a second voltage signal line and an output terminal, and is configured to output an output signal to the output terminal under control of the level of the third node; and
   the second control circuit is electrically connected to the first node, the third node and a first voltage signal line, and is configured to control the level of the third node under control of the level of the first node, and
   wherein the first voltage signal line and the second voltage signal line are two different voltage signal lines, and wherein a pulse width of the input signal is different from a pulse width of the first clock signal, and the pulse width of the input signal is different from a pulse width of the second clock signal.

2. The shift register unit according to claim 1, wherein the first control circuit comprises a fourth transistor, a fifth transistor, and a first capacitor;
   a gate electrode of the fourth transistor is electrically connected to the second node, a first electrode of the fourth transistor is configured to receive the second clock signal, and a second electrode of the fourth transistor is electrically connected to a fourth node;
   a gate electrode of the fifth transistor is configured to receive the second clock signal, a first electrode of the fifth transistor is electrically connected to the fourth node, a second electrode of the fifth transistor is electrically connected to the third node; and
   a first electrode of the first capacitor is electrically connected to the second node, and a second electrode of the first capacitor is electrically connected to the fourth node.

3. The shift register unit according to claim 1, further comprising an output reset circuit,
   wherein the output reset circuit is electrically connected to the first node and the output terminal, and is configured to reset the output terminal under control of the level of the first node.

4. The shift register unit according to claim 3, further comprising a third control circuit,
   wherein the third control circuit is electrically connected to the first node, and is configured to adjust, by coupling, the level of the first node under control of the level of the first node.

5. The shift register unit according to claim 1, wherein the first input circuit comprises a first transistor,
   a gate electrode of the first transistor is configured to receive the first clock signal, a first electrode of the first transistor is configured to receive the input signal, and a second electrode of the first transistor is electrically connected to the first node.

6. The shift register unit according to claim 1, wherein the second input circuit comprises a second transistor and a third transistor,
   a gate electrode of the second transistor is electrically connected to the first node, a first electrode of the second transistor is configured to receive the first clock signal, and a second electrode of the second transistor is electrically connected to the second node; and
   a gate electrode of the third transistor is configured to receive the first clock signal, a first electrode of the third transistor is configured to receive a first low voltage, and a second electrode of the third transistor is electrically connected to the second node.

7. The shift register unit according to claim 1, wherein the second control circuit comprises a sixth transistor,
   a gate electrode of the sixth transistor is electrically connected to the first node, a first electrode of the sixth transistor is configured to receive a first voltage from the first voltage signal line, and a second electrode of the sixth transistor is electrically connected to the third node.

8. The shift register unit according to claim 1, wherein the output circuit comprises a seventh transistor and a second capacitor,
   a gate electrode of the seventh transistor is electrically connected to the third node, a first electrode of the seventh transistor is configured to receive a second voltage from the second voltage signal line, and a second electrode of the seventh transistor is electrically connected to the output terminal; and
   a first electrode of the second capacitor is electrically connected to the third node, and a second electrode of the second capacitor is electrically connected to the first electrode of the seventh transistor.

9. The shift register unit according to claim 3, wherein the output reset circuit comprises an eighth transistor, a gate electrode of the eighth transistor is electrically connected to the first node, a first electrode of the eighth transistor is configured to receive a second low voltage, and a second electrode of the eighth transistor is electrically connected to the output terminal.

10. The shift register unit according to claim 4, wherein the third control circuit comprises a ninth transistor and a third capacitor,
a gate electrode of the ninth transistor is electrically connected to the first node, a first electrode of the ninth transistor is configured to receive the second clock signal, a second electrode of the ninth transistor is electrically connected to a first electrode of the third capacitor, and a second electrode of the third capacitor is electrically connected to the first node.

11. The shift register unit according to claim 7, wherein the first voltage received from the first voltage signal line is a high voltage.

12. The shift register unit according to claim 8, wherein the second voltage received from the second voltage signal line is a high voltage.

13. A driving circuit, comprising a plurality of cascaded shift register units each of which is according to claim 1, wherein except a first-stage of the shift register units, any one of the shift register units of other stages is connected with the output terminal of a shift register unit of a preceding stage before the any one of the shift register units of other stages.

14. The driving circuit according to claim 13, further comprising a first clock signal line and a second clock signal line,
wherein a (2n−1)th-stage of the shift register units is electrically connected to the first clock signal line to receive the first clock signal, and the (2n−1)th-stage of the shift register units is electrically connected to the second clock signal line to receive the second clock signal;
a (2n)th-stage of the shift register units is electrically connected to the second clock signal line to receive the first clock signal, and the (2n)th-stage of the shift register units is electrically connected to the first clock signal line to receive the second clock signal; and
n is an integer greater than zero.

15. A display device, comprising the driving circuit according to claim 13.

16. The display device according to claim 15, further comprising a plurality of pixel units arranged in an array,
wherein each of the plurality of pixel units comprises a pixel circuit, the pixel circuit comprises a data writing sub-circuit, a driving sub-circuit, and a light-emitting control sub-circuit;
an output terminal of an (n)th-stage of the shift register units in the driving circuit is electrically connected to a control terminal of the light-emitting control sub-circuit of the pixel circuit in an (n)th row of the pixel units; and
n is an integer greater than zero.

17. A driving method of the shift register unit according to claim 1, comprising a preliminary stage, a pull-up stage, a high-potential maintenance stage, a pull-down stage, and a low-potential maintenance stage, wherein
in the preliminary stage, causing the second clock signal to be changed in level, causing the input signal to be changed in level, and causing the level of the first node to be pulled up;
in the pull-up stage, causing the second clock signal to be changed in level, causing the level of the third node to be pulled down, and causing a level of the output signal to be pulled up;
in the high-potential maintenance stage, causing the second clock signal to be changed in level, causing the level of the first node to be maintained, causing the level of the output signal to be maintained at a high level, and adjusting a pulse width of the output signal by adjusting a pulse width of the input signal;
in the pull-down stage, causing the first clock signal to be changed in level, causing the level of the first node to be pulled down, causing the level of the third node to be pulled up, and causing the level of the output signal to be pulled down; and
in the low-potential maintenance stage, causing the level of the first node to be maintained, causing the level of the third node to be maintained, and causing the level of the output signal to be maintained.

18. The driving method according to claim 17, wherein adjusting the pulse width of the output signal by adjusting the pulse width of the input signal comprises:
in a case where the pulse width of the output signal needs to be increased, causing the level of the input signal to be maintained to a time point, in a next period of the first clock signal, when the first clock signal is changed in level once thereby causing the pulse width of the output signal to be delayed by one period of the first clock signal.

19. The driving method according to claim 17, wherein a duty cycle of the first clock signal and a duty cycle of the second clock signal are both greater than 50%.

* * * * *